United States Patent
Yang et al.

(10) Patent No.: US 10,269,915 B2
(45) Date of Patent: Apr. 23, 2019

(54) VERTICAL MOS TRANSISTOR AND FABRICATING METHOD THEREOF

(71) Applicant: TAIWAN SEMICONDUCTOR MANUFACTURING CO., LTD., Hsinchu (TW)

(72) Inventors: Tai-I Yang, Hsinchu (TW); Yung-Chih Wang, Taoyuan (TW); Shin-Yi Yang, New Taipei (TW); Chih-Wei Lu, Hsinchu (TW); Hsin-Ping Chen, Hsinchu County (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/615,901

(22) Filed: Jun. 7, 2017

(65) Prior Publication Data
US 2018/0308947 A1    Oct. 25, 2018

Related U.S. Application Data

(60) Provisional application No. 62/489,440, filed on Apr. 24, 2017.

(51) Int. Cl.
*H01L 29/49* (2006.01)
*H01L 29/66* (2006.01)
(Continued)

(52) U.S. Cl.
CPC ........ *H01L 29/49* (2013.01); *H01L 21/76885* (2013.01); *H01L 29/0649* (2013.01);
(Continued)

(58) Field of Classification Search
None
See application file for complete search history.

(56) References Cited

U.S. PATENT DOCUMENTS

| | | | | |
|---|---|---|---|---|
| 2010/0207172 | A1* | 8/2010 | Masuoka | H01L 21/823807 257/255 |
| 2015/0287911 | A1* | 10/2015 | Kim | H01L 43/12 438/3 |

(Continued)

FOREIGN PATENT DOCUMENTS

JP    WO2017085788 A1 *  6/2017

OTHER PUBLICATIONS

Xining Zang et al.,"Graphene Synthesis Via Droplet CVD and Its Photonic Applications", IEEE, MEMS 2014, Jan. 26-30, 2014, p. 486-489.

(Continued)

*Primary Examiner* — Mounir S Amer
(74) *Attorney, Agent, or Firm* — McClure, Qualey & Rodack, LLP (57) ABSTRACT

A vertical MOS transistor includes a substrate, a metal line disposed on the substrate, a semiconductor pillar disposed on and in contact with the metal line, a gate dielectric layer disposed surrounding the semiconductor pillar, a metal gate disposed surrounding a portion of the semiconductor pillar, and a gate electrode disposed in contact with the metal gate. In some embodiments, a width of an end of the gate electrode in contact with the metal gate is narrower than a width of an end of the gate electrode away from the metal gate.

20 Claims, 5 Drawing Sheets

(51) Int. Cl.
    *H01L 29/43*     (2006.01)
    *H01L 29/12*     (2006.01)
    *H01L 29/06*     (2006.01)
    *H01L 21/768*     (2006.01)

(52) U.S. Cl.
    CPC ............ *H01L 29/12* (2013.01); *H01L 29/435* (2013.01); *H01L 29/66666* (2013.01)

(56) References Cited

U.S. PATENT DOCUMENTS

2015/0303301 A1* 10/2015 Masuoka ............ H01L 29/7828
    257/328
2018/0122940 A1* 5/2018 Masuoka ............ H01L 29/7827

OTHER PUBLICATIONS

Yu Jiang et al., "Development of electroless Co via-prefill to enable advanced BEOL metallization and via resistance reduction", IEEE, May 23-26, 2016, p. 111-113.

Vincent Ip et al., "Ion Beam Patterning of High-Density STT-RAM Devices", IEEE Transactions on Magnetics, vol. 53, No. 2, Date of Publication: Aug. 26, 2016.

* cited by examiner

VERTICAL MOS TRANSISTOR AND FABRICATING METHOD THEREOF

CROSS-REFERENCE TO RELATED APPLICATION

This application claims priority to U.S. Provisional Application Ser. No. 62/489,440, filed Apr. 24, 2017, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-14B respectively are perspective views and cross-sectional views of vertical MOS transistors at various stages of fabrication according to various embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Vertical Metal-Oxide-Semiconductor (MOS) transistors and the methods of forming the same are provided in accordance with various exemplary embodiments. The intermediate stages of forming the vertical MOS transistors are illustrated in accordance with exemplary embodiments. The variations and the operation of the vertical MOS transistors are discussed. Throughout the various views and illustrative embodiments, like reference numbers are used to designate like elements.

Figure 1A:
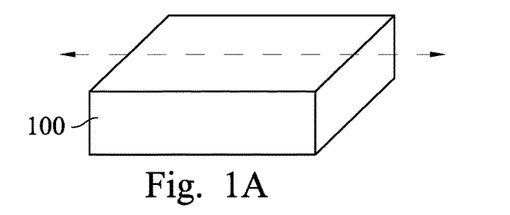
Figure 1B:
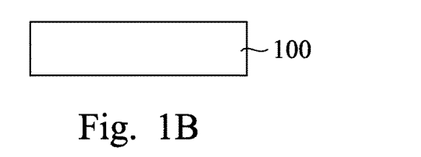

FIGS. 1A-14B respectively are perspective views and cross-sectional views of vertical MOS transistors at various stages of fabrication according to various embodiments of the present disclosure. Referring to FIGS. 1A and 1B, a substrate 100 is provided. The substrate 100 can be a portion of a semiconductor wafer. In some embodiments, the substrate 100 may be a semiconductor substrate such as a silicon substrate, although other materials such as silicon germanium, silicon carbon, and the like, may be used. In some other embodiments, the substrate 100 may also be a bulk semiconductor substrate or a silicon-on-insulator substrate.

Figure 2A:
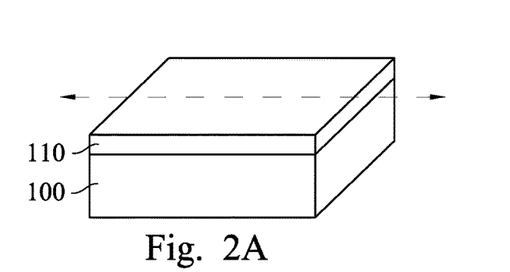
Figure 2B:
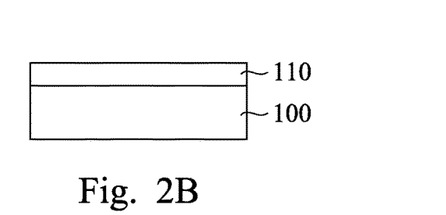

Referring to FIGS. 2A and 2B, a dielectric layer 110 is formed on the top surface of the substrate 100. In some embodiments, the dielectric layer 110 is a silicon oxide layer, and the dielectric layer 110 can be formed by for example, using a thermal oxidation process or chemical vapor deposition (CVD) process.

Figure 3A:
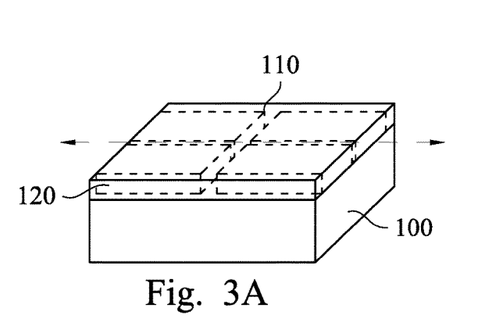
Figure 3B:
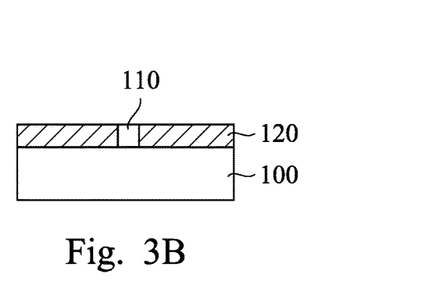

Referring to FIGS. 3A and 3B, a plurality metal lines 120 are formed in the dielectric layer 110. In some embodiments, the dielectric layer 110 is patterned to form a plurality of cavities therein, and a metal layer is deposited on the dielectric layer 110 and fills into the cavities. After the metal layer fills the cavities, a planarization process is performed to remove the portions of the metal layer exceeding the dielectric layer 110, thus remaining segments of the metal layer become metal lines 120, and the metal lines 120 are embedded in the dielectric layer 110.

In some embodiments, the thickness of dielectric layer 110 may be in a range from about 10 Å to about 100 Å. However, the values recited throughout the description are merely examples, and may be changed to different values. In some embodiments, a mask layer (not shown) is formed on the dielectric layer 110, for example, using low-pressure chemical vapor deposition (LPCVD), plasma enhanced chemical vapor deposition (PECVD), or the like. The mask layer is used as a hard mask during subsequent photolithography processes for patterning the dielectric layer 110.

In some embodiments, the metal layer is deposited on dielectric layer 110 and in the cavities. The material of the metal layer can be copper, aluminum, cobalt, tungsten, or the alloy thereof. In some embodiments, the thickness of the metal layer is thicker than depth of the cavities, thus the metal material can completely fill the cavities. In some embodiments, a pitch between the adjacent metal lines 120 is in a range from about 10 nm to about 60 nm. However, the values recited throughout the description are merely examples, and may be changed to different values.

Figure 4A:
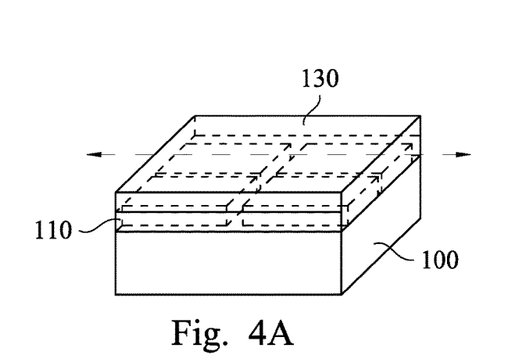
Figure 4B:
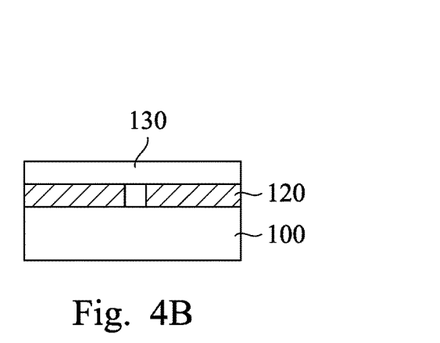

Reference is made to FIGS. 4A and 4B. An isolation layer 130 is formed on the dielectric layer 110 and the metal lines 120. The isolation layer 130 can be formed on the dielectric layer 110 and the metal lines 120 by any suitable deposition process. In some embodiments, the isolation layer 130 is a silicon oxide layer or a silicon nitride layer. In some embodiments, the thickness of the isolation layer 130 is in a range from about 10 Å to about 200 Å. However, the values recited throughout the description are merely examples, and may be changed to different values.

Figure 5A:
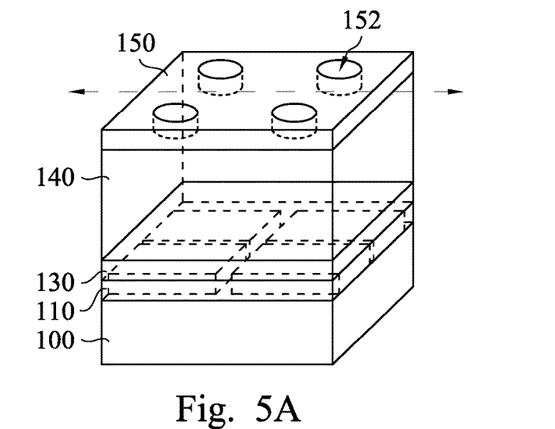
Figure 5B:
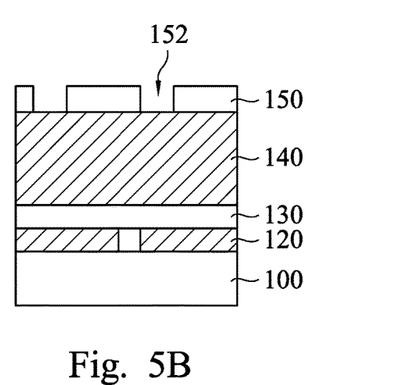

Reference is made to FIGS. 5A and 5B. A metal gate layer 140 is formed over isolation layer 130. The metal gate layer 140 can be formed by suitable deposition process. In some embodiments, the metal gate layer 140 may include Cu, Al, Ti, Ta, W, Mo, Ru, Pt, Co, Ni, Pd, Nb, or alloys thereof. In some other embodiments, the metal gate layer 140 may include metallic compound, such as TiN, TaC, or TaN. In some embodiments, the thickness of the metal gate layer 140 is in a range from about 100 Å to about 500 Å. However, the values recited throughout the description are merely examples, and may be changed to different values.

After the metal gate layer 140 is formed on the isolation layer 130, a patterned hard mask layer 150 is formed over on the metal gate layer 140. The hard mask layer 150 may include silicon nitride, although other materials such as silicon oxide or oxynitride may be used. The hard mask layer 150 is patterned to form a plurality of holes 152 therein. In some embodiments, the diameter of the holes 152 is in a range from about 5 nm to about 30 nm. However, the values recited throughout the description are merely examples, and may be changed to different values.

Figure 6A:
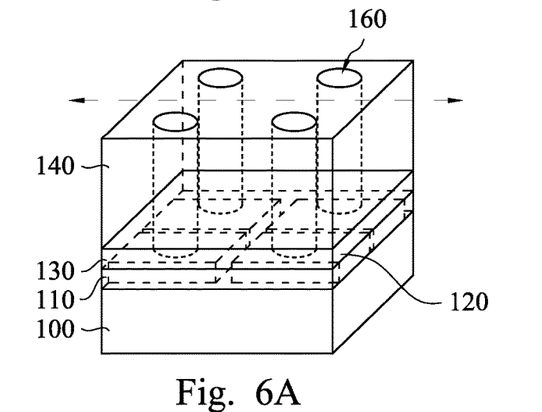
Figure 6B:
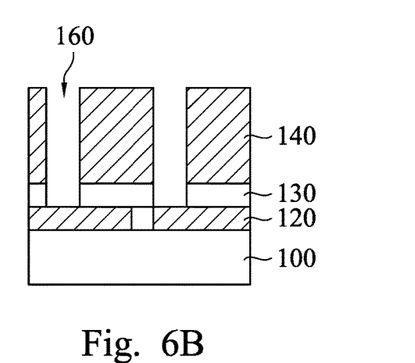

Reference is made to FIGS. 6A and 6B. An etching process can be applied in etching high aspect ratio is performed to etch the metal gate layer 140 and the isolation layer 130 by using the hard mask layer 150 as the mask. In some embodiments, the reactive ion etching (RIE) is utilized for anisotropic etching the metal gate layer 140. RIE or ion-enhanced etching works by a combination of physical and chemical mechanisms for achieving selectivity and anisotropicity during the etching process. For example, three processes compete with each other during plasma etching; physical bombardment by ions, chemical etching by radicals and ions, and surface passivation by the deposition of passivating films. In some embodiments, for example, etching high aspect ratio features such as vias, high density plasma (HDP) etching which has a higher density of ions and operates at lower pressures has been increasingly used in etching high aspect ratio features. One variable for increasing anisotropicity in etching high aspect ratio openings is to vary the RF power for altering the concentration of ions and radicals and to vary the bias power applied to the semiconductor wafer for varying the energy of the impacting ions and radicals.

After the RIE process is performed, a plurality of vias 160 are formed in the metal gate layer 140 and the isolation layer 130. Portions of the metal lines 120 are exposed by the vias 160. Namely, the vias 160 are formed penetrated the metal gate layer 140 and the isolation layer 130 and lead to the metal lines 120. The hard mask layer is removed after the vias 160 are formed.

Figure 7A:
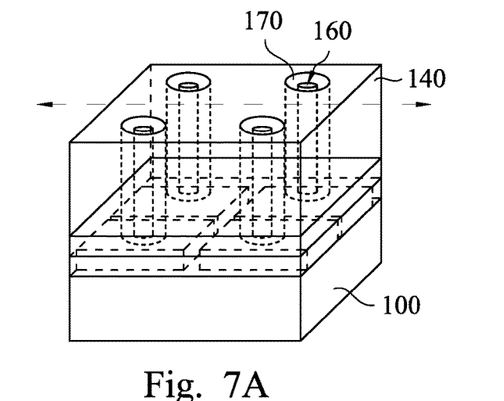
Figure 7B:
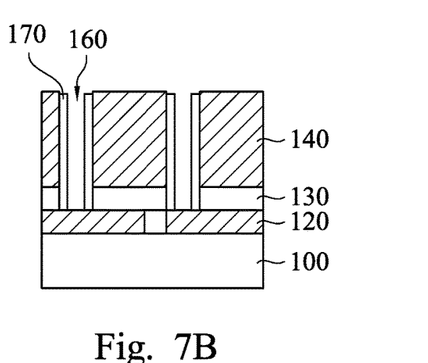

Reference is made to FIGS. 7A and 7B. A gate dielectric layer 170 is formed in the vias 160. The gate dielectric layer 170 may be dielectric materials such as oxides, nitrides, oxynitrides, high-k materials, combinations thereof. In some embodiments, the gate dielectric layer 170 may include multi-layers. In some embodiments, the gate dielectric layer 170 is an oxide layer. The gate dielectric layer 170 may be formed by using suitable thermal treatment techniques, wet treatment techniques or deposition techniques such as PVD, CVD, ALD or the like. In some embodiments, the gate dielectric layer 170 is formed on the sidewall of the via 160 by a spacer process. In some embodiments, the thickness of the gate dielectric layer 170 is in a range from about 10 Å to about 100 Å. However, the values recited throughout the description are merely examples, and may be changed to different values. In some embodiments, an etch back process is performed to remove the portions of the gate dielectric layer at the bottom of the vias 160 thereby exposing the metal lines 120 through the vias 160.

Figure 8A:
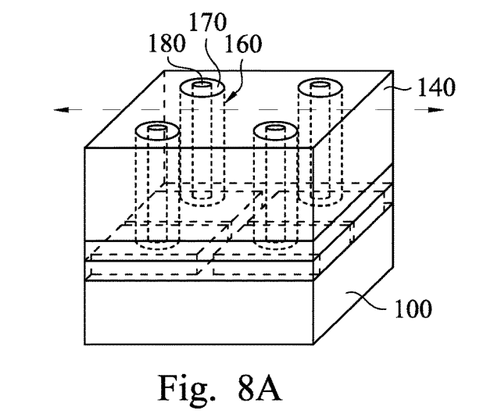
Figure 8B:
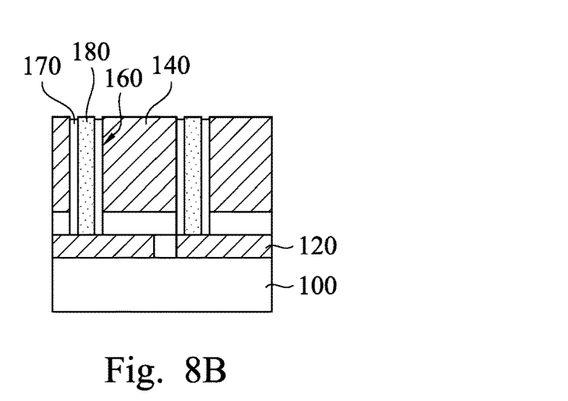

Reference is made to FIGS. 8A and 8B. A semiconductor material is deposited in the vias 160 from bottom to top thereby forming a plurality of semiconductor pillars 180 in the vias 160. The semiconductor pillars 180 are in contact with the metal lines 120, respectively. The semiconductor material can be graphene with boron/phosphorous doping, cobalt with boron/phosphorous doping, nickel with boron/phosphorous doping, or tungsten with boron/phosphorous doping as semiconductor. The semiconductor material can form as N/P type by boron/phosphorous implant, or CVD/ALD deposition of adding gas of boron/phosphorous doping. In some embodiments, the semiconductor material is deposited by using low temperature CVD process, such as at the temperature at 100° C. to 200° C. Such backend end structure and process with low thermo-budget and reduce thermo effect.

In some embodiments, the semiconductor material includes graphene. Graphene is a one atom thick material composed of carbon atoms structured in a honeycomb hexagonal lattice. In the case of the bottom up approach, the graphene is formed via the rearrangements of the carbon atoms in a CVD process. The deposition of the graphene CVD process includes synthesizing graphene sheets with proper reaction gases. In some embodiments, the CVD process includes three stages, in the first stage, reduction gases of Ar:H2 (300:55 sccm) flow into the vias under a heating process at a speed of 20° C./min. When the temperature is stabilized for pyrolysis reaction, reaction gas, such as CH4 is added for 10 minutes for the synthesis of graphene. In the final stage, the structure is cooled down at a speed of 20° C./min with the protection gases of H2 and Ar flowing. It is found that the combination of right temperature can produce successful growth of graphene, including continuous graphene films. However, the values recited throughout the description are merely examples, and may be changed to different values.

Figure 9A:
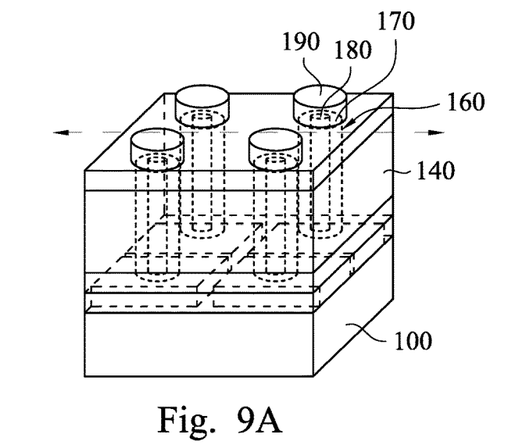
Figure 9B:
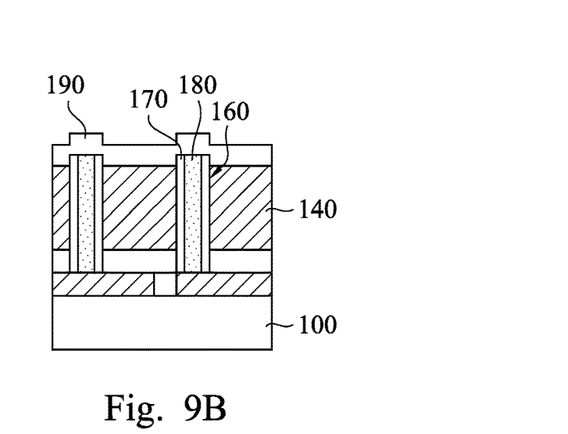

Reference is made to FIGS. 9A and 9B. After the semiconductor pillars 180 are formed in the vias 160, a pulling back process is performed to remove top portion of the metal gate layer 140 and to reduce the thickness of the metal gate layer 140. That is, portions of the semiconductor pillars 180 are protruded from the top surface of metal gate layer 140.

After the pulling back process is performed, a spacer layer 190 is formed on the top surfaces of the semiconductor pillars 180 and on the top surface of the metal gate layer 140. In some embodiments, the spacer layer 190 may be formed by blanket depositing one or more layers over the semiconductor pillars 180 and the metal gate layer 140. The spacer layer 190 may include SiN, oxynitride, SiC, SiON, oxide, and the like and may be formed by methods such as CVD, plasma enhanced CVD, sputter, and other methods known in the art. In some embodiments, the portion of the spacer layer 190 over the semiconductor pillar 180 and the gate dielectric layer 170 is protruded from the portion of the spacer layer 190 over the metal gate layer 140.

Figure 10A:
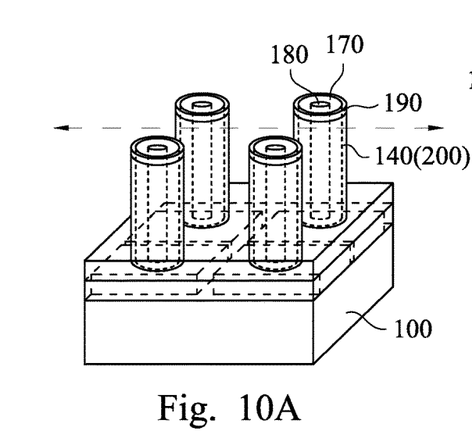
Figure 10B:
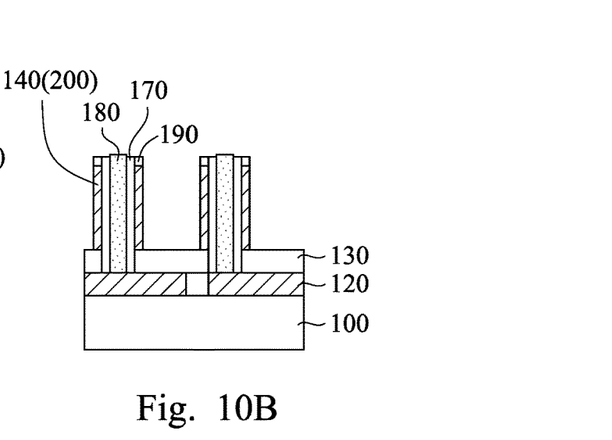

The spacer layer 190 may be patterned, such as by isotropically or anisotropically etching, thus the remaining portions of the spacer layer 190 can be utilized as mask for defining the metal gates 200 around the semiconductor pillars 180. In some embodiments, the patterned spacer layer 190 is utilized as a mask during defining the metal gates 200 around the semiconductor pillars 180. In some embodiments, portions of the metal gate layer 140 uncovered by the patterned spacer layer 190 are removed, and the portions of the metal gate layer 140 covered by the patterned spacer layer 190 are remained. The remaining portions of the metal gate layer 140 are regarded as the metal gates 200 arranged around the semiconductor pillars 180.

Figure 11A:
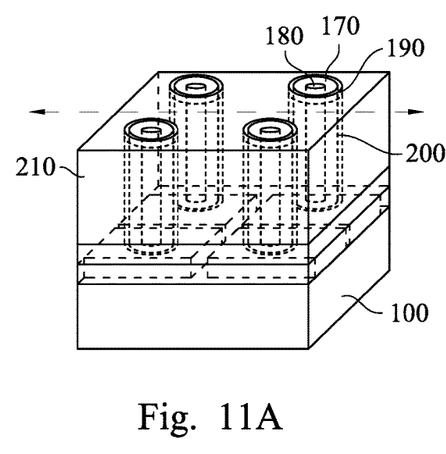
Figure 11B:
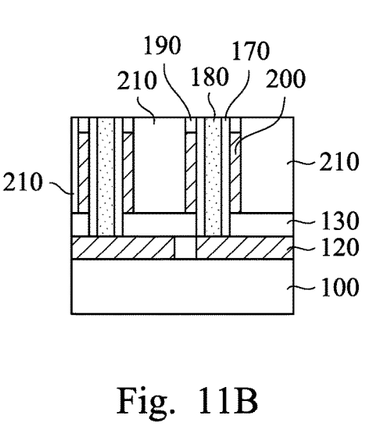

Reference is made to FIGS. 11A and 11B. An inter-layer dielectric (ILD) layer 210 is formed over the top surface of the semiconductor device shown in FIGS. 10A and 10B. The ILD layer 210 may be formed of various low-k dielectric material, such as doped (oxygen-doped SiC(ODC); nitrogen-doped SiC(NDC)) and undoped silicon carbide (UDC) layers deposited using different precursors: tetramethylsilane (MS); ethynyltrimethylsilane (ETMS), vinylphenylmethylsilane (VPMS) and phenyldimethylsilane (DMPS). NDC has a composition of Si, C, N and H. ODC has a composition of Si, C, O, H, while UDC has a composition of Si, C, and H.

The ILD layer 210 is formed on the top surface of the isolation layer 130 and fills into the spaces between the semiconductor pillars 180. In some embodiments, the ILD layer 210 is formed after the semiconductor pillars 180 and the metal gate 200 are formed. After the ILD layer 210 is formed, a planarizing process, such as a CMP process, is performed to flatten the top surface of the structure, followed by a cleaning step. The goal of the cleaning process ("post-CMP cleaning") is to remove residues left by the CMP step from the semiconductor structure surface without significantly etching the metal, leaving deposits on the surface, or imparting significant contamination to the semiconductor structure. A cleaning solution may contain various chemicals that perform different functions during the cleaning process. A cleaning solution contains a cleaning agent, which is the component of solution that removes residual CMP slurry particles, typically particles of metal, from the surface of the semiconductor structure. In some embodiments, the cleaning solution is selected to react with the spacer layer 190, and the spacer layer 190 is removed during the post-CMP cleaning process. In some embodiments, after the spacer layer 190 is removed, the top surfaces of semiconductor pillars 180 and the top surface of the surrounding gate dielectric layer 170 are at the same level, and top surfaces of the metal gates 200 arranged around the semiconductor pillars 180 are lower than the top surfaces of the semiconductor pillars 180.

Figure 12A:
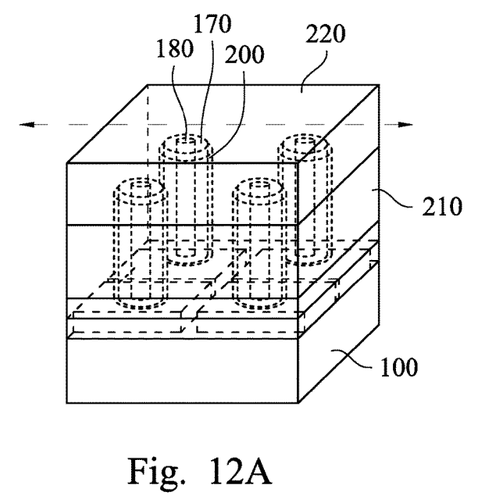
Figure 12B:
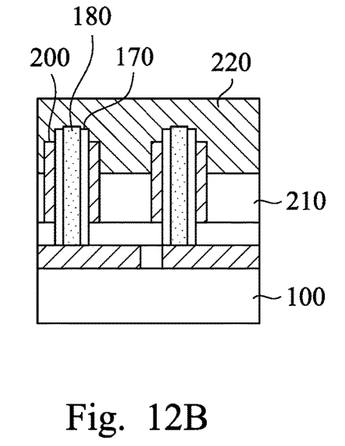

Reference is made to FIGS. 12A and 12B. Top portion of the ILD layer 210 is removed, and the portions of the side surfaces of the metal gates 200 are not covered by the ILD layer 210. In some embodiments, the top portion of the ILD layer 210 is removed by an etch back process, in which the etch back process can be performed by using an etchant having selectivity between the ILD layer 210 and other material. Therefore, the semiconductor pillars 180, the gate dielectric layers 190, and the metal gates 200 would not be etched during the process of etching the ILD layer 210. After the etch back process is performed, portions of the semiconductor pillars 180, the gate dielectric layer 170, and the metal gate 200 are protruded from the ILD layer 210.

After the ILD layer 210 is etched back, a gate electrode layer 220 is formed on the ILD layer 210. The gate electrode layer 220 can be formed by suitable deposition process. In some embodiments, the gate electrode layer 220 may include Cu, Al, Co, W, or alloys thereof. In some embodiments, the thickness of the gate electrode layer 220 is in a range from about 20 nm to about 500 nm. However, the values recited throughout the description are merely examples, and may be changed to different values. In some embodiments, the gate electrode layer 220 is formed on the ILD layer 210 and covers the semiconductor pillars 180, the gate dielectric layers 190, and the metal gates 200.

Figure 13A:
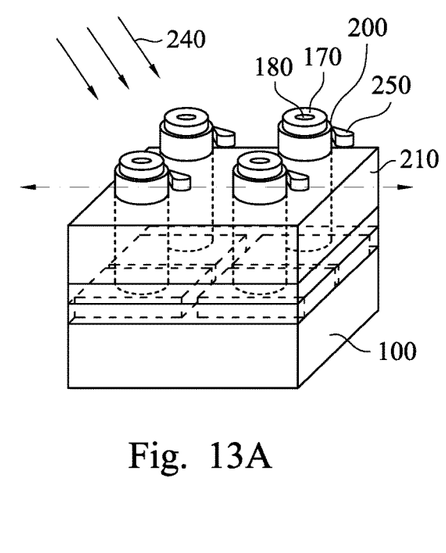
Figure 13B:
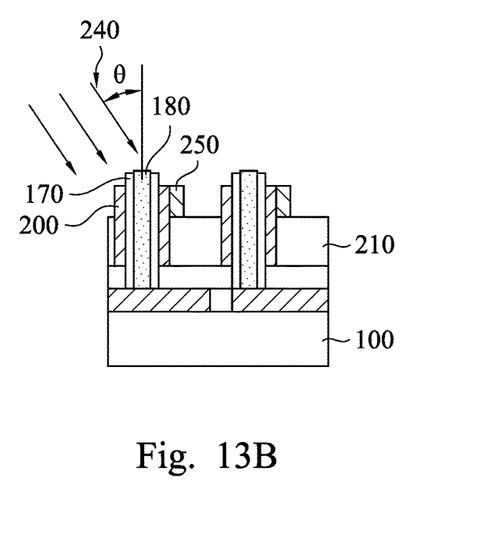

Reference is made to FIGS. 13A and 13B. The gate electrode layer is patterned thereby forming a plurality of gate electrodes 230 on the ILD layer 210. In some embodiments, the gate electrode layer is patterned by using suitable etching process, such as RIE process. In some embodiments, the process of patterning the gate electrode layer includes using ion beam or plasma etching the gate electrode layer. In some embodiments, a gas is first introduced into a reaction chamber and then plasma is generated from the gas. This is accomplished by dissociation of the gas into ions, free radicals and electrons by using a radio frequency (RF) generator, which includes one or more electrodes. The electrons are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material, e.g. the gate electrode layer, on the semiconductor wafer to form residual products which leave the wafer surface and thus, etch the material from the wafer. In the embodiments of using RIE process, removal of material comes as a combined result of chemical reactions and physical impact. Generally the ions are accelerated by a voltage applied in a vacuum. The effect of their impact is aided by the introduction of a chemical which reacts with the surface of the material, e.g. the gate electrode layer, being etched. The reaction makes the surface softer and as such increases both the relative control of the etching as well as the etching rate. The RIE process permits accurate etching of the material. Specific selection of different materials further permits an RIE process to soften one layer without significantly softening another. In some embodiments, only the gate electrode layer is removed, and other materials, such as the semiconductor pillars 180, the gate dielectric layers 190, and the metal gates 200 are still remained. The softening of the gate electrode layer induced by the RIE process allows for substantially precise removal of exposed portions of the gate electrode layer without substantially etching of the underlying ILD layer 210.

In some embodiments, the RIE process is performed substantially along a side of the structure illustrated in FIG. 12A at an angle θ with ion beams 240. During the RIE process, the semiconductor pillars 180, the gate dielectric layer 170, and the metal gate 200 do not react with the ion beams 240 and can be utilized to shield portions of the ions beams 240. Therefore, the semiconductor pillars 180, the gate dielectric layer 170, and the metal gate 200 shadow at least a portion of the gate electrode layer. As the ion beams 240 are emanating from a source that is generally not directly perpendicular to the semiconductor pillars 180, the gate dielectric layer 170, and the metal gate 200, the protective shadow is angled or cylindrical. As the ion beams 240 remove exposed portions of the gate electrode layer, the portions of the gate electrode layer protected by the angled or cylindrical shadows are remained and form a plurality of gate electrodes 250 respectively in contact with the corresponding metal gate 200.

In some embodiments, the gate electrodes 250 have a droplet-like profile, in top view. The width of each of the gate electrodes 250 at the end closer to the semiconductor pillars 180 is narrow than that at the end away from the semiconductor pillars 180. For example, an ion bombardment is utilized to define the metal gate electrode 250 by pillar shadow like of some degree tilting, in which the bombard gas can be Ar, He, $N_2$, or Ne. Metal polymers will deposit during processing and cause the droplet-like profile. In some embodiments, the thickness of the gate electrode 250 is decreased depending on the distance to the semiconductor pillar 180.

Figure 14A:
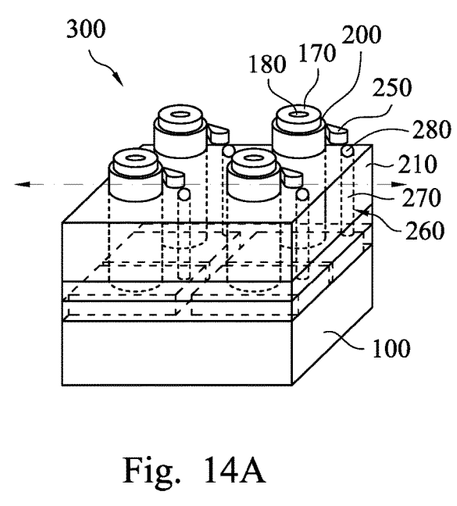
Figure 14B:
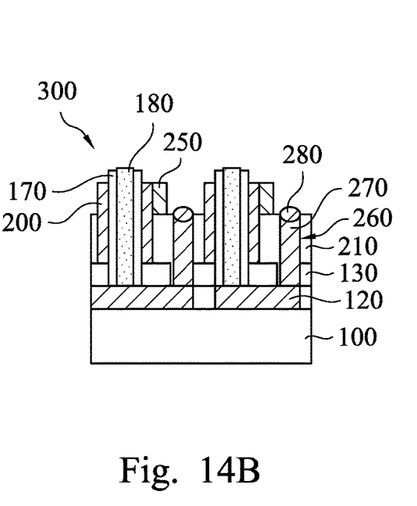

Reference is made to FIGS. 14A and 14B. An etching process is performed to etch the ILD layer 210 and the isolation layer 130. In some embodiments, the RIE or HDP plasma etching is utilized for anisotropic and vertically etching the ILD layer 210, and the mask for the etching process is not shown in the figures. After the etching process is performed, a plurality of vias 260 are formed in the ILD layer 210 and the isolation layer 130. Portions of the metal lines 120 are exposed by the vias 260. Namely, the vias 260 aside the gate electrodes 250 are formed penetrated the ILD layer 210 and the isolation layer 130 and lead to the metal lines 120. In some embodiments, the diameter of the vias 260 is in a range from about 10 nm to about 20 nm. However, the values recited throughout the description are merely examples, and may be changed to different values.

After the vias 260 are formed in the ILD layer 210 and the isolation layer 130, a conductive material is deposited in the vias 260 from bottom to top thereby forming a plurality of conductive pillars 270 in the vias 260. The conductive pillars 270 are in contact with the metal lines 120, respectively. In some embodiments, the conductive material can be graphene, cobalt, nickel, or tungsten. In some embodiments, the conductive pillars 270 are bottom-up grown in the vias 260, and the conductive pillars 270 respectively have ball heads. The ball heads of the conductive pillars are regarded as a plurality of ball contacts 280 at the top of the conductive pillars 270. In some embodiments, the contacts 280 have round top surfaces and are protruded from the ILD layer 210. The bottom-up filling process can avoid the voids in the vias 260 and the problem of metal diffusion. The bottom-up filling process can reduce the via resistance by removing sidewall barrier which gives the low resistivity fill metal larger cross section area.

A plurality of vertical MOS transistors 300 are formed accordingly. The semiconductor pillars 180 surrounded by the metal gate 200 are regarded as channels of the vertical MOS transistors 300, and the top portions of the semiconductor pillars 180, which are not surrounded by the metal gate 200 can be regarded as drains of the vertical MOS transistors 300. The conductive pillars 270 and the metal lines 120 are regarded as sources of the vertical MOS transistors 300, and the contacts 280 at the top of the conductive pillars 270 can be regarded as source contacts of the vertical MOS transistors 300.

By using the bottom-up growing semiconductor pillars in low temperature can reduce turn off leakage current (Ioff), short channel effect, thermo-budget, and provide high electron mobility. The vertical MOS transistors fabricated by the method can reach small device scale and increase device density, and the ratio of the channel width and the gate length can be increased. Furthermore, each of the vertical MOS transistors provides plural gate sides and can reach good control and property. The gate dielectric layers are formed after the vias are defined and before the semiconductor material are grown, thus strength of the structure can be improved. The metal gates around the gate dielectric layers are formed by using the spacer layer as mask, thus the metal gates are taper and strong. The gate electrodes are formed by shadow etching without additional lithography. The droplet-like shape of the gate electrodes provides wider window for pickup alignment.

According to some embodiments, a vertical MOS transistor includes a substrate, a metal line disposed on the substrate, a semiconductor pillar disposed on and in contact with the metal line, a gate dielectric layer disposed surrounding the semiconductor pillar, a metal gate disposed surrounding a portion of the semiconductor pillar, and a gate electrode disposed in contact with the metal gate. In some embodiments, a width of an end of the gate electrode in contact with the metal gate is narrower than a width of an end of the gate electrode away from the metal gate.

According to some embodiments, a vertical MOS transistor includes a substrate, a metal line disposed on the substrate, a semiconductor pillar disposed on and in contact with the metal line, and a metal gate disposed surrounding a portion of the semiconductor pillar. In some embodiments, a material of the semiconductor pillar comprises graphene with boron or phosphorous doping, cobalt with boron or phosphorous doping, nickel with boron or phosphorous doping, or tungsten with boron or phosphorous doping. In some embodiments, a top portion of the semiconductor pillar is not surrounded by the metal gate.

According to some embodiments, a method for fabricating a vertical MOS transistor includes following steps. A metal gate layer is formed over a substrate. A first via is formed in the metal gate layer. A gate dielectric layer is formed on a side surface of the first via. A semiconductor material is grown from a bottom to a top of the first via to form a semiconductor pillar in the first via. The metal gate layer is patterned to form a metal gate surrounding the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a vertical MOS transistor, the method comprising:
   forming a metal line over a substrate;
   depositing a first dielectric layer over the metal line;
   forming a metal gate layer over the first dielectric layer;
   forming a first via hole in the metal gate layer and the first dielectric layer to expose a portion of the metal line;
   forming a gate dielectric layer on a sidewall of the first via hole;
   forming a pillar in the first via hole after forming the gate dielectric layer, such that a bottom surface of the pillar is in contact with the metal line; and
   patterning the metal gate layer to form a metal gate around the gate dielectric layer.

2. The method of claim 1, wherein the pillar comprises graphene, cobalt, nickel, or tungsten.

3. The method of claim 1, further comprising:
   forming a second dielectric layer around the metal gate.

4. The method of claim 3, further comprising:
forming a gate electrode layer over the second dielectric layer; and
patterning the gate electrode layer to form a gate electrode in contact with the metal gate.

5. The method of claim 4, wherein patterning the gate electrode layer is performed such that the gate electrode tapers toward the metal gate.

6. The method of claim 4, wherein patterning the gate electrode layer is performed such that the gate electrode has a tip, a first sidewall, a second sidewall meeting the first sidewall at the tip, and a third sidewall connecting the first sidewall and the second sidewall.

7. The method of claim 6, wherein patterning the gate electrode layer is performed such that the third sidewall is rounded.

8. The method of claim 6, wherein patterning the gate electrode layer is performed such that the tip of the gate electrode is in contact with the metal gate.

9. The method of claim 4, wherein patterning the gate electrode layer comprises:
etching the gate electrode layer using an ion beam, wherein the ion beam is non-parallel with a longitudinal direction of the pillar.

10. The method of claim 1, further comprising:
recessing the metal gate layer, such that top portions of the gate dielectric layer and the pillar protrude from a top surface of the recessed metal gate layer.

11. The method of claim 10, further comprising:
forming a spacer layer over the recessed metal gate layer, the gate dielectric layer, and the pillar; and
patterning the spacer layer, such that the patterned spacer layer is on a sidewall of the top portion of the gate dielectric layer.

12. The method of claim 11, wherein patterning the metal gate layer comprises:
etching a first portion of the recessed metal gate layer that is uncovered by the patterned spacer layer, wherein a second portion of the recessed metal gate layer remains under the patterned spacer layer to form the metal gate.

13. The method of claim 1, further comprising:
forming a second dielectric layer over the first dielectric layer after patterning the metal gate layer.

14. The method of claim 13, further comprising:
forming a second via hole in the second dielectric layer and the first dielectric layer to expose the metal line; and
forming a conductive pillar in the second via hole.

15. A method comprising:
forming a pillar over a substrate and a metal gate around the pillar;
forming a dielectric layer over the pillar, the metal gate, and the substrate;
recessing the dielectric layer, such that top portions of the pillar and the metal gate protrude from a top surface of the recessed dielectric layer;
forming a gate electrode layer over the recessed dielectric layer, wherein the gate electrode layer is in contact with a sidewall of the top portion of the metal gate; and
etching the gate electrode layer using an ion beam, wherein the ion beam is non-parallel with a longitudinal direction of the pillar.

16. The method of claim 15, wherein the etching the gate electrode layer is performed such that a portion of the ion beam is shielded by the metal gate.

17. The method of claim 15, wherein forming the gate electrode layer is performed such that the gate electrode layer is in contact with a top surface of the top portion of the metal gate.

18. A method comprising:
forming a pillar over a substrate and a metal gate around the pillar;
forming a dielectric layer over the pillar, the metal gate, and the substrate;
recessing the dielectric layer, such that top portions of the pillar and the metal gate protrude from a top surface of the recessed dielectric layer;
forming a gate electrode layer over the recessed dielectric layer;
etching the gate electrode layer to form a gate electrode;
wherein etching gate electrode layer is performed such that the gate electrode has a tip, a first sidewall, a second sidewall meeting the first sidewall at the tip, and a third sidewall connecting the first sidewall and the second sidewall; and
wherein etching gate electrode layer is performed such that a top surface of the gate electrode is lower than a top surface of the pillar.

19. The method of claim 18, wherein etching the gate electrode layer is performed such that the third sidewall is rounded.

20. The method of claim 18, wherein the gate electrode layer is etched using an ion beam, wherein the ion beam is not perpendicular to the top surface of the pillar.

* * * * *